US010927045B2

(12) United States Patent
Xu

(10) Patent No.: US 10,927,045 B2
(45) Date of Patent: Feb. 23, 2021

(54) CERAMIC COMPOSITE MATERIALS AND METHODS

(71) Applicant: Florida State University Research Foundation, Inc., Tallahassee, FL (US)

(72) Inventor: Chengying Xu, Tallahassee, FL (US)

(73) Assignee: Florida State University Research Foundation, Inc., Tallahassee, FL (US)

( * ) Notice: Subject to any disclaimer, the term of this patent is extended or adjusted under 35 U.S.C. 154(b) by 2 days.

(21) Appl. No.: 16/244,660

(22) Filed: Jan. 10, 2019

(65) Prior Publication Data

US 2020/0024200 A1    Jan. 23, 2020

Related U.S. Application Data

(62) Division of application No. 15/492,628, filed on Apr. 20, 2017, now Pat. No. 10,214,455.

(Continued)

(51) Int. Cl.
| | |
|---|---|
| *H01B 1/04* | (2006.01) |
| *B82Y 30/00* | (2011.01) |
| *H01B 1/02* | (2006.01) |
| *C04B 35/80* | (2006.01) |
| *C04B 35/628* | (2006.01) |

(Continued)

(52) U.S. Cl.
CPC .......... *C04B 35/806* (2013.01); *B82Y 30/00* (2013.01); *C04B 35/58* (2013.01); *C04B 35/62844* (2013.01); *C04B 35/62886* (2013.01); *C04B 35/62894* (2013.01); *C04B 35/64* (2013.01); *H01B 1/02* (2013.01); *H01B 1/04* (2013.01); *C04B 2235/3873* (2013.01); *C04B 2235/483* (2013.01); *C04B 2235/526* (2013.01); *C04B 2235/5248* (2013.01); *C04B 2235/5264* (2013.01); *C04B 2235/5268* (2013.01); *C04B 2235/5288* (2013.01);
(Continued)

(58) Field of Classification Search
CPC ............. B82Y 30/00; H01B 1/02; H01B 1/04
USPC .......................... 252/500, 502, 506, 510, 511
See application file for complete search history.

(56) References Cited

U.S. PATENT DOCUMENTS

| | | | | |
|---|---|---|---|---|
| 7,867,468 B1 * | 1/2011 | Haddon | ................. | B82Y 30/00 423/447.1 |
| 2010/0196695 A1 * | 8/2010 | Garcia | ................... | B82Y 30/00 428/323 |

(Continued)

FOREIGN PATENT DOCUMENTS

JP    H04-241181 A    8/1992

OTHER PUBLICATIONS

Peng "Composite Carbon Nanotube/Silica Fibers with Improved Mechanical Strengths and Electrical Conductivities." Small 2008, 4, No. 11, 1964-1967 (Year: 2008).*

(Continued)

*Primary Examiner* — Tri V Nguyen
(74) *Attorney, Agent, or Firm* — Eversheds Sutherland (US) LLP

(57) ABSTRACT

Provided herein are methods of making composite materials. The methods may include infiltrating a carbon nanoscale fiber network with a ceramic precursor, curing the ceramic precursor, and/or pyrolyzing the ceramic precursor. The infiltrating, curing, and pyrolyzing steps may be repeated one or more times. Composite materials also are provided that include a ceramic material and carbon nanoscale fibers.

11 Claims, 7 Drawing Sheets

Related U.S. Application Data

(60) Provisional application No. 62/325,748, filed on Apr. 21, 2016.

(51) Int. Cl.
*C04B 35/64* (2006.01)
*C04B 35/58* (2006.01)
*H05K 9/00* (2006.01)

(52) U.S. Cl.
CPC .... *C04B 2235/616* (2013.01); *C04B 2235/77* (2013.01); *C04B 2235/96* (2013.01); *H05K 9/009* (2013.01)

(56) References Cited

U.S. PATENT DOCUMENTS

| | | |
|---|---|---|
| 2011/0045274 A1 | 2/2011 | Bao |
| 2012/0208002 A1 | 8/2012 | Todd |
| 2012/0282453 A1 | 11/2012 | Wang |
| 2016/0176156 A1 | 6/2016 | Xu |

OTHER PUBLICATIONS

Chandrashekar Forming carbon nanotube composites by directly coating forests with inorganic materials using low pressure chemical vapor deposition. Thin Solid Films 517 (2008) 525-530 (Year: 2008).*

Xu "Polymer-Derived Ceramics: Electronic Properties and Application" from https://stars.library.ucf.edu/cgi/viewcontent.cgi?article=1788&context=etd (Year: 2006).*

An, et al. "Carbon-nanotube-reinforced polymer-derived ceramic composites", Advanced Materials, vol. 16, Issue 22, pp. 2036-2040 (2004).

Berbon, et al. "Transverse thermal conductivity of thin C/SiC composites fabricated by slurry infiltration and pyrolysis", J. Am. Ceram. Soc. vol. 84, pp. 2229-2234 (2001).

Clark, et al. "Polymer precursor-based preparation of carbon nanotube-silicon carbide nanocomposites", J. Am. Ceram. Soc. vol. 95, pp. 328-337 (2012).

Peigney, A. "Composite materials: tougher ceramics with nanotubes", Nature Materials, vol. 2, Issue 1, pp. 15-16 (2003).

Wang, et al. "Contact-damage-resistant ceramic/single-wall carbon nanotubes and ceramic/graphite composites", Nature Materials vol. 3, pp. 539-544 (2004).

Shao et al., "Ceramic nanocomposites reinforced with a high volme fraction of carbon nanofibers," Materials Letters 68, 2012, 108-111.

Sarkar et al., "Polymer-Derived Ceramic Composite Fibers with Aligned Pristine Multiwalled Carbon Nanotubes," Appl Mater & Interf. 2010, 2(4):1150-1156.

* cited by examiner

CERAMIC COMPOSITE MATERIALS AND METHODS

CROSS-REFERENCE TO RELATED APPLICATIONS

This application is a divisional application of U.S. patent application Ser. No. 15/492,628, filed Apr. 20, 2017, which claims priority to U.S. Provisional Patent Application No. 62/325,748, filed Apr. 21, 2016. Both of these applications are incorporated herein by reference.

STATEMENT REGARDING FEDERALLY SPONSORED RESEARCH OR DEVELOPMENT

This invention was made with government support under contract numbers N00014-11-1-0706 and N00014-14-1-0543 awarded by the Office of Naval Research. The government has certain rights in the invention.

BACKGROUND

Ceramic composites, which may be used in a number of applications, typically include a ductile phase embedded in a ceramic material.

Existing methods of making ceramic composites typically include embedding ceramic powders in a polymer phase. Due to the presence of a polymer phase, the flexibility of these ceramic composites is generally restricted to mild temperatures (e.g., 200° C. or less). Moreover, strong ionic/covalent bonding typically imparts conventional ceramic composites with strong mechanical properties while undermining the composites' flexibility.

These limitations can be disadvantageous, because many applications may benefit from or require compliant and/or flexible ceramic composites. The ability to deform flexibly is desirable for many advanced applications, such as thermal protection systems and battery materials.

Carbon nanotubes (CNTs) are known for their remarkable intrinsic mechanical, electrical, and thermal properties. As a result, CNTs have been used to improve the electrical properties of composite materials, but the CNTs can be difficult to disperse, completely or otherwise, into matrices, including ceramic matrices. Existing methods for making a composite containing ceramic materials and carbon nanotubes are based on mixing carbon nanotubes in ceramic powders or ceramic polymeric precursors directly. These methods, however, can produce composites containing only a limited volume fraction of carbon nanotubes in the ceramic matrix.

There remains a need for improved composite materials and methods of making composite materials containing carbon nanotubes and a ceramic matrix, including composite materials that include a relatively high volume fraction of carbon nanotubes, are flexible, and/or have a relatively high electrical conductivity.

BRIEF SUMMARY

Provided herein are composite materials that address one or more of the foregoing needs, and include a ceramic material and carbon nanoscale fibers.

In one aspect, methods of forming composite materials are provided. The methods, in embodiments, comprise [1] providing a carbon nanoscale fiber network which comprises a plurality of substantially aligned carbon nanoscale fibers; [2] infiltrating the carbon nanoscale fiber network with a first amount of a liquid ceramic precursor; [3] curing the first amount of the liquid ceramic precursor to form a cured ceramic precursor; and [4] pyrolyzing the cured ceramic precursor to form the composite material. The volume fraction of the carbon nanoscale fibers in the composite materials may be at least 35%, or about 40% to about 80%. The electrical conductivity of the composite material may be about $2.0 \times 10^4$ S/m to about $3.0 \times 10^4$ S/m. In particular embodiments, the methods further comprise [1] infiltrating a second amount of the liquid ceramic precursor into the composite material; [2] curing the second amount of the liquid ceramic precursor to form a second amount of a cured ceramic precursor; and [3] pyrolyzing the second amount of the cured ceramic precursor.

In another aspect, composite materials are provided. In embodiments, the composite materials comprise a ceramic material dispersed in a carbon nanoscale fiber network which comprises a plurality of substantially aligned carbon nanoscale fibers. The composite material may have (i) a volume fraction of the carbon nanoscale fibers of at least 35%, and/or (ii) an electrical conductivity of at least $1.75 \times 10^4$ S/m. The composite materials also may be flexible, as described herein.

DETAILED DESCRIPTION

Figure 1:
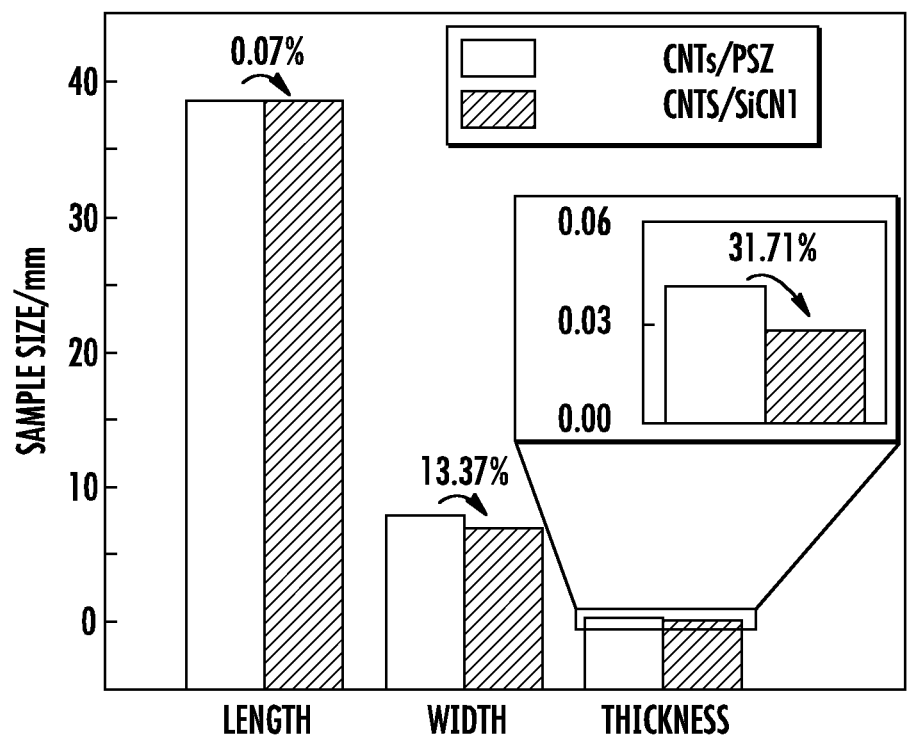
FIG. 1 depicts the shrinkage of one embodiment of a composite material upon pyrolysis.

Composite materials, and methods of making composite materials, are provided that include a ceramic material and carbon nanoscale fibers. The composite materials may [1] include a relatively high volume fraction of carbon nanoscale fibers, [2] be flexible, [3] have a relatively high electrical conductivity, [4] have a relatively high tensile strength, [5] have a relatively long fiber pullout, [6] have a relatively high thermal conductivity, and/or [7] a combination thereof.

It was surprisingly discovered that the composite materials herein may include a ceramic material and a relatively high volume fraction of carbon nanoscale fibers, and/or embodiments of the composite materials may be flexible. In certain embodiments, the composite materials herein may be subjected to a rigorous flexibility test, such as the tests described herein, without breaking. The flexibility tests may unexpectedly have little or no effect on the flexural strength and/or modulus of the composite materials. For example, the flexibility tests may impact the flexural strength and/or modulus of the composite materials by no more than 10%, 7.5%, 5%, 2.5%, or 1%. The "relatively high" volume fraction of carbon nanoscale fibers in the composite materials herein may be at least 35%, e.g., from 35% to 80%.

The composite materials provided herein, in embodiments, may surprisingly have a relatively high electrical conductivity, at least along the direction of fiber alignment. For example, in one embodiment, the composite materials may have an electrical conductivity along the direction of fiber alignment that is similar to that of graphite in the basal plane.

Methods of Forming Composite Materials

The methods of forming a composite material provided herein may comprise providing a carbon nanoscale fiber network which comprises a plurality of substantially aligned carbon nanoscale fibers.

The phrase "carbon nanoscale fiber network", as used herein, refers to a macroscopic aggregate of carbon nanoscale fibers. The carbon nanoscale fiber networks herein may be in the form of a sheet (i.e., film) or strip (i.e., ribbon). The carbon nanoscale fiber networks generally may have any dimensions suited to a particular application. For example, the carbon nanoscale fiber networks may have a length of about 10 cm to about 10 m, a width of about 7 mm to about 10 mm, and a thickness of about 10 µm to about 50 µm. Other dimensions are envisioned, including lengths and/or widths that exceed 10 m. Carbon nanoscale fiber networks are available commercially, or may be formed by techniques known in the art, such as dispersing carbon nanoscale fibers in a non-solvent and filtering and/or evaporating the non-solvent. The carbon nanoscale fibers of the carbon nanoscale fiber networks may be substantially aligned prior to and/or after the formation of the carbon nanoscale fiber networks. For example, the carbon nanoscale fibers of a dispersion may be aligned prior to filtering and/or evaporating a non-solvent, and/or the carbon nanoscale fiber networks may be stretched, as described herein.

The carbon nanoscale fibers of the carbon nanoscale fiber network are "substantially aligned" when at least 20% of the carbon nanoscale fibers, by weight, are arranged within ±5° of parallel to a particular axis. In some embodiments, at least 30%, at least 40%, at least 50%, at least 60%, at least 70%, at least 80%, or at least 90%, by weight, of the plurality of carbon nanoscale fibers are arranged within ±5° of parallel to a particular axis.

In embodiments, the providing of the carbon nanoscale fiber network which comprises a plurality of substantially aligned carbon nanoscale fibers may include [1] providing a carbon nanoscale fiber network which comprises a plurality of randomly oriented carbon nanoscale fibers; and [2] stretching the carbon nanoscale fiber network to substantially align the plurality of randomly oriented carbon nanoscale fibers, wherein the stretching of the carbon nanoscale fiber network imparts the carbon nanoscale fiber network with a stretch ratio of about 10% to about 70%. In one embodiment, the stretch ratio is about 25% to about 45%. In another embodiment, the stretch ratio is about 35%.

The stretching may substantially align the plurality of randomly oriented carbon nanoscale fibers. A plurality of carbon nanoscale fibers is "randomly oriented" when no more than 20% of the carbon nanoscale fibers, by weight, are arranged within ±5° of parallel to a particular axis.

The stretching of the carbon nanoscale fiber network generally may include applying a stretching force to the network. The stretching force may be applied along a single axis. For example, if the carbon nanoscale fiber network is in the form of a ribbon, a stretching force may be applied to the ends of the ribbon, or, alternatively, along the entire sides of the ribbon. The stretching force generally may be sufficient to achieve any of the stretch ratios described herein.

The stretching force may be applied mechanically. The mechanical stretching may be achieved by applying a stretching force to the carbon nanoscale fiber network with any means known in the art, including one or more rollers, such as pinch rollers.

The stretching of the carbon nanoscale fiber networks may impart the carbon nanoscale fiber networks with a stretch ratio of about 10% to about 70%. The "stretch ratio" is determined by the following equation:

$$(D2-D1)/D1*100 = \text{Stretch Ratio}$$

wherein D1 is the original dimension of the network along the axis to which the stretching force is applied, and D2 is the new dimension of the network, after stretching, along the same axis. For example, if the network is in the shape of a ribbon 10 m long and 0.5 m wide, and a stretching force applied to the ends of the ribbon increases the length of the ribbon to 12 m, then the stretch ratio is 20%. In one embodiment, the stretch ratio is about 10% to about 70%. In another embodiment, the stretch ratio is about 10% to about 60%. In a further embodiment, the stretch ratio is about 10% to about 50%. In a still further embodiment, the stretch ratio is about 20% to about 50%. In some embodiments, the stretch ratio is about 25% to about 45%. In a particular embodiment, the stretch ratio is about 35%.

The stretching steps may increase the bulk density of the carbon nanoscale fiber networks. In embodiments, the stretching steps described herein may increase the bulk density of the carbon nanoscale fiber networks by about 20% to about 50%, about 30% to about 40%, or about 35%. In other words, a carbon nanoscale fiber network having an original bulk density of about 0.6 g/cm may have a bulk density of about 0.72 g/cm (20% greater) to about 0.9 g/cm (50% greater) after stretching.

The methods provided herein may include infiltrating the carbon nanoscale fiber network with a liquid ceramic precursor. The carbon nanoscale fiber network that is infiltrated with the liquid ceramic precursor may be a network that includes randomly oriented carbon nanoscale fibers, substantially aligned carbon nanoscale fibers, or a combination thereof.

The infiltration may be performed in a manner that permits the liquid ceramic precursor to (i) adsorb to one or more surfaces of the carbon nanoscale fiber network, (ii) penetrate the carbon nanoscale fiber network, or (iii) a combination thereof. In one embodiment, the liquid ceramic precursor penetrates the carbon nanoscale fiber network, and, therefore, is disposed in the internal structure of the carbon nanoscale fiber network. In another embodiment, the liquid ceramic precursor is adsorbed to one or more surfaces of the carbon nanoscale fiber network, and disposed in the internal structure of the carbon nanoscale fiber network. The liquid ceramic precursor may be disposed and/or dispersed evenly or unevenly on one or more surfaces or in the internal structure, respectively, of the carbon nano scale fiber network.

After the infiltrating of the carbon nanoscale fiber network with the liquid ceramic precursor, the liquid ceramic precursor may be adsorbed to one or both sides of the carbon nanoscale fiber network when, for example, the carbon nanoscale fiber network is in the shape of a sheet or ribbon. The phrase "one or both sides" refers to the surfaces of the sheet or ribbon that are opposite each other and have the largest surface areas of all the surfaces of the sheet or ribbon, respectively. In addition or alternative to "one or both sides", the liquid ceramic precursor may be adsorbed to one or more of the surfaces of the edges of the ribbon or sheet. The "surfaces of the edges" of the ribbon or sheet include those portions having one dimension defined by the thickness of the ribbon or sheet, respectively. The amount of liquid ceramic precursor per surface area unit (e.g., $cm^2$, $mm^2$, etc.) of the one or more surfaces of the carbon nanoscale fiber network may be substantially equal (±5%) or unequal.

The liquid ceramic precursor may penetrate the carbon nanoscale fiber network, and, therefore, be disposed in the internal structure of the carbon nanoscale fiber network. The "internal structure" of a carbon nanoscale fiber network includes the network formed by the carbon nanoscale fibers and portions thereof that cannot be contacted by touching an external surface of the carbon nanoscale fiber network. For example if three sheets of a carbon nanoscale fiber network were stacked, then the "internal structure" of the middle sheet is formed by the carbon nanoscale fibers and portions thereof that do not contact the first and third sheets. The liquid ceramic precursor that penetrates the carbon nanoscale fiber network may be adsorbed to carbon nanoscale fibers having at least a portion that exists beneath a surface of the carbon nanoscale fiber network, and/or the disposed in the interstitial space between the carbon nanoscale fibers having at least a portion that exists beneath a surface of the carbon nanoscale fiber network. The amount of liquid ceramic precursor per volume (e.g., $mm^3$, $\mu m^3$, etc.) in the internal structure of the carbon nanoscale fiber networks may be substantially equal (±5%) or unequal.

The infiltrating of the carbon nanoscale fiber network with the liquid ceramic precursor may be performed using any techniques known in the art. For example, the infiltrating may be achieved with a filtering apparatus. The carbon nanoscale fiber network may be placed on the filtering apparatus, and the liquid ceramic precursor may infiltrate the carbon nanoscale fiber network as the liquid ceramic precursor contacts the carbon nanoscale fiber network. The filtration may be assisted by vacuum pressure, positive pressure, or a combination thereof. The liquid ceramic precursor also may be heated before and/or during the infiltrating step. Heating the liquid ceramic precursor may lower its viscosity, thereby easing the filtration and/or increasing the amount of liquid ceramic precursor that infiltrates the carbon nanoscale fiber network.

Generally, a carbon nanoscale fiber network of any size may be subjected to the infiltrating step. The size of the carbon nanoscale fiber network may be limited, in some instances, only by the size of the filtering apparatus. The filtering apparatus may be configured to operate continuously, thereby permitting the infiltration of large carbon nanoscale fiber networks, such as carbon nanoscale fiber networks having at least one dimension of 10 m or more. Other sizes are envisioned.

The methods provided herein also may include curing the liquid ceramic precursor to form a cured ceramic precursor. In embodiments, curing the liquid ceramic precursor comprises heating the carbon nanoscale fiber network that has been infiltrated with a liquid ceramic precursor to a temperature effective to cure the liquid ceramic precursor. In one embodiment, curing the liquid ceramic precursor comprises heating the carbon nanoscale fiber network infiltrated with a liquid ceramic precursor to a temperature of about 100° C. to about 200° C., about 100° C. to about 180° C., about 120° C. to about 180° C., about 120° C. to about 160° C., about 130° C. to about 150° C., or about 140° C. The carbon nanoscale fiber network infiltrated with a liquid ceramic precursor may be heated for about 1 hour to about 48 hours, about 6 hours to about 36 hours, about 12 hours to about 36 hours, or about 24 hours. In particular embodiments, the liquid ceramic precursor comprises polysilazane, and the carbon nanoscale fiber network infiltrated with the liquid ceramic precursor is heated to about 140° C. for about 24 hours to cure the liquid ceramic precursor.

The methods provided herein also may include pyrolyzing the cured ceramic precursor. The pyrolysis may occur at any temperature for any time effective to convert the cured liquid ceramic precursor to a ceramic material. For example, the pyrolysis may occur at a temperature of about 500° C. to about 1,500° C., about 800° C. to about 1,200° C., or about 1,000° C. The pyrolysis also may occur under an inert atmosphere, such as a nitrogen atmosphere.

The infiltrating, curing, and pyrolyzing steps may be repeated one or more times. In one embodiment, the infiltrating, curing, and pyrolyzing steps are repeated once. In another embodiment, the infiltrating, curing, and pyrolyzing steps are repeated twice. Not wishing to be bound by any particular theory, it is believed that repeating the infiltrating, curing, and pyrolyzing steps may increase the density of the resulting composite material. The density may be increased because at least a portion of any pores and/or empty spaces in a composite material at the conclusion of a pyrolysis step may be at least partially filled by liquid ceramic precursor when the infiltrating, curing, and pyrolyzing steps are repeated.

In embodiments, the methods provided herein comprise [1] providing a carbon nanoscale fiber network which comprises a plurality of substantially aligned carbon nanoscale fibers; [2] infiltrating the carbon nanoscale fiber network with a first amount of a liquid ceramic precursor; [3] curing the first amount of the liquid ceramic precursor to form a cured ceramic precursor; [4] pyrolyzing the cured ceramic precursor to form the composite material; [5] infiltrating a second amount of the liquid ceramic precursor into the composite material; [6] curing the second amount of the liquid ceramic precursor to form a second amount of a cured ceramic precursor; and [7] pyrolyzing the second amount of the cured ceramic precursor, wherein the volume fraction of the carbon nanoscale fibers in the composite material is at least 35%.

In one embodiment, the methods provided herein comprise [1] providing a carbon nanoscale fiber network which comprises a plurality of substantially aligned carbon nanoscale fibers; [2] infiltrating the carbon nanoscale fiber network with a first amount of a liquid ceramic precursor comprising polysilazane; [3] curing the first amount of the liquid ceramic precursor comprising polysilazane to form a cured ceramic precursor; [4] pyrolyzing the cured ceramic precursor to form a carbon nanoscale fiber/silicon carbonitride composite material.

Composite Materials

Composite materials also are provided herein, which may comprise a ceramic material dispersed in a carbon nanoscale fiber network which comprises a plurality of substantially aligned carbon nanoscale fibers. In one embodiment, the ceramic material comprises silicon carbonitride. The ceramic material may be unevenly or at least substantially evenly dispersed in and/or on the carbon nanoscale fiber network.

The volume fraction of carbon nanoscale fibers in the composite materials may be at least 35%. In one embodiment, the volume fraction of carbon nanoscale fibers in the composite materials is about 40% to about 80%. In another embodiment, the volume fraction of carbon nanoscale fibers in the composite materials is about 40% to about 75%. In a further embodiment, the volume fraction of carbon nanoscale fibers in the composite materials is about 50% to about 70%. In a particular embodiment, the volume fraction of carbon nanoscale fibers in the composite materials is about 60%. The volume fraction of carbon nanoscale fibers in the composite materials may be determined by calculating the relative density change as the materials are produced, as explained, for example, at Example 3.

The composite materials provided herein may have an electrical conductivity of at least $1.75 \times 10^4$ S/m, according to the measurement technique described at Example 4. Therefore, a composite material has an electrical conductivity of at least $1.75 \times 10^4$ S/cm when its conductivity along [1] its length and/or [2] the direction perpendicular to the length is at least $1.75 \times 10^4$ S/cm. In one embodiment, the composite materials have an electrical conductivity of about $1.8 \times 10^4$ S/m to about $3.0 \times 10^4$ S/m. In another embodiment, the composite materials have an electrical conductivity of about $2.0 \times 10^4$ S/m to about $3.0 \times 10^4$ S/m. In a further embodiment, the composite materials have an electrical conductivity of about $2.0 \times 10^4$ S/m to about $2.5 \times 10^4$ S/m. In an additional embodiment, the composite materials have an electrical conductivity of about $2.0 \times 10^4$ S/m to about $2.25 \times 10^4$ S/m.

In embodiments, the volume fraction of carbon nanoscale fibers in the composite material is at least 35%, about 40% to about 80%, about 40% to about 75%, about 50% to about 70%, or about 60%; and the electrical conductivity of the composite material is at least $1.75 \times 10^4$ S/cm.

In embodiments, the volume fraction of carbon nanoscale fibers in the composite material is at least 35%, about 40% to about 80%, about 40% to about 75%, about 50% to about 70%, or about 60%; and the electrical conductivity of the composite material is about $1.8 \times 10^4$ S/m to about $3.0 \times 10^4$ S/m.

In embodiments, the volume fraction of carbon nanoscale fibers in the composite material is at least 35%, about 40% to about 80%, about 40% to about 75%, about 50% to about 70%, or about 60%; and the electrical conductivity of the composite material is about $2.0 \times 10^4$ S/m to about $3.0 \times 10^4$ S/m.

In embodiments, the volume fraction of carbon nanoscale fibers in the composite material is at least 35%, about 40% to about 80%, about 40% to about 75%, about 50% to about 70%, or about 60%; and the electrical conductivity of the composite material is about $2.0 \times 10^4$ S/m to about $2.5 \times 10^4$ S/m.

In embodiments, the volume fraction of carbon nanoscale fibers in the composite material is at least 35%, about 40% to about 80%, about 40% to about 75%, about 50% to about 70%, or about 60%; and the electrical conductivity of the composite material is about $2.0 \times 10^4$ S/m to about $2.25 \times 10^4$ S/m.

The composite materials provided herein also may be flexible. A composite material is "flexible" when, according to the flexibility test described at Example 2, it can be bent at least 500 times at a bending percentage of at least 50% without breaking. The composite material may return to a shape that is at least substantially similar to its original shape after each bending. In one embodiment, the composite materials provided herein can be elastically deformed (i.e., bent) at least 500 times at a bending percentage of at least 60%, at least 70%, at least 75%, at least 80%, at least 90%, or 100% without breaking. In another embodiment, the composite materials provided herein can be bent at least 1,000 times at a bending percentage of at least 60%, at least 70%, at least 75%, at least 80%, at least 90%, or 100% without breaking.

In embodiments, the composite material is flexible; the volume fraction of carbon nanoscale fibers in the composite material is at least 35%, about 40% to about 80%, about 40% to about 75%, about 50% to about 70%, or about 60%; and the electrical conductivity of the composite material is at least $1.75 \times 10^4$ S/cm.

In embodiments, the composite material is flexible; the volume fraction of carbon nanoscale fibers in the composite material is at least 35%, about 40% to about 80%, about 40% to about 75%, about 50% to about 70%, or about 60%; and the electrical conductivity of the composite material is about $1.8 \times 10^4$ S/m to about $3.0 \times 10^4$ S/m.

In embodiments, the composite material is flexible; the volume fraction of carbon nanoscale fibers in the composite material is at least 35%, about 40% to about 80%, about 40% to about 75%, about 50% to about 70%, or about 60%; and the electrical conductivity of the composite material is about $2.0 \times 10^4$ S/m to about $3.0 \times 10^4$ S/m.

In embodiments, the composite material is flexible; the volume fraction of carbon nanoscale fibers in the composite material is at least 35%, about 40% to about 80%, about 40% to about 75%, about 50% to about 70%, or about 60%; and the electrical conductivity of the composite material is about $2.0 \times 10^4$ S/m to about $2.5 \times 10^4$ S/m.

In embodiments, the composite material is flexible; the volume fraction of carbon nanoscale fibers in the composite material is at least 35%, about 40% to about 80%, about 40% to about 75%, about 50% to about 70%, or about 60%; and the electrical conductivity of the composite material is about $2.0 \times 10^4$ S/m to about $2.25 \times 10^4$ S/m.

The composite materials provided herein may have a tensile strength of at least 350 MPa, at least 400 MPa, or at least 450 MPa, as determined by the method described at Example 3. In embodiments, the composite material has a tensile strength of about 400 MPa to about 800 MPa, about 400 MPa to about 700 MPa, about 450 MPa to about 650 MPa, or about 500 MPa to about 600 MPa. In one embodiment, the composite material is flexible, and has a tensile strength of at least 350 MPa, at least 400 MPa, or at least 450 MPa. In further embodiments, the composite material is flexible, and has a tensile strength of about 400 MPa to about 800 MPa, about 400 MPa to about 700 MPa, about 450 MPa to about 650 MPa, or about 500 MPa to about 600 MPa.

In embodiments, the composite material is flexible; the tensile strength of the composite material is at least 350 MPa; the volume fraction of carbon nanoscale fibers in the composite material is at least 35%, about 40% to about 80%, about 40% to about 75%, about 50% to about 70%, or about 60%; and the electrical conductivity of the composite material is at least $1.75 \times 10^4$ S/cm.

In embodiments, the composite material is flexible; the tensile strength of the composite material is at least 350

MPa; the volume fraction of carbon nanoscale fibers in the composite material is at least 35%, about 40% to about 80%, about 40% to about 75%, about 50% to about 70%, or about 60%; and the electrical conductivity of the composite material is about $1.8 \times 10^4$ S/m to about $3.0 \times 10^4$ S/m.

In embodiments, the composite material is flexible; the tensile strength of the composite material is at least 350 MPa; the volume fraction of carbon nanoscale fibers in the composite material is at least 35%, about 40% to about 80%, about 40% to about 75%, about 50% to about 70%, or about 60%; and the electrical conductivity of the composite material is about $2.0 \times 10^4$ S/m to about $3.0 \times 10^4$ S/m.

In embodiments, the composite material is flexible; the tensile strength of the composite material is at least 350 MPa; the volume fraction of carbon nanoscale fibers in the composite material is at least 35%, about 40% to about 80%, about 40% to about 75%, about 50% to about 70%, or about 60%; and the electrical conductivity of the composite material is about $2.0 \times 10^4$ S/m to about $2.5 \times 10^4$ S/m.

In embodiments, the composite material is flexible; the tensile strength of the composite material is at least 350 MPa; the volume fraction of carbon nanoscale fibers in the composite material is at least 35%, about 40% to about 80%, about 40% to about 75%, about 50% to about 70%, or about 60%; and the electrical conductivity of the composite material is about $2.0 \times 10^4$ S/m to about $2.25 \times 10^4$ S/m.

In embodiments, the composite material is flexible; the tensile strength of the composite material is at least 400 MPa; the volume fraction of carbon nanoscale fibers in the composite material is at least 35%, about 40% to about 80%, about 40% to about 75%, about 50% to about 70%, or about 60%; and the electrical conductivity of the composite material is at least $1.75 \times 10^4$ S/cm.

In embodiments, the composite material is flexible; the tensile strength of the composite material is at least 400 MPa; the volume fraction of carbon nanoscale fibers in the composite material is at least 35%, about 40% to about 80%, about 40% to about 75%, about 50% to about 70%, or about 60%; and the electrical conductivity of the composite material is about $1.8 \times 10^4$ S/m to about $3.0 \times 10^4$ S/m.

In embodiments, the composite material is flexible; the tensile strength of the composite material is at least 400 MPa; the volume fraction of carbon nanoscale fibers in the composite material is at least 35%, about 40% to about 80%, about 40% to about 75%, about 50% to about 70%, or about 60%; and the electrical conductivity of the composite material is about $2.0 \times 10^4$ S/m to about $3.0 \times 10^4$ S/m.

In embodiments, the composite material is flexible; the tensile strength of the composite material is at least 400 MPa; the volume fraction of carbon nanoscale fibers in the composite material is at least 35%, about 40% to about 80%, about 40% to about 75%, about 50% to about 70%, or about 60%; and the electrical conductivity of the composite material is about $2.0 \times 10^4$ S/m to about $2.5 \times 10^4$ S/m.

In embodiments, the composite material is flexible; the tensile strength of the composite material is at least 400 MPa; the volume fraction of carbon nanoscale fibers in the composite material is at least 35%, about 40% to about 80%, about 40% to about 75%, about 50% to about 70%, or about 60%; and the electrical conductivity of the composite material is about $2.0 \times 10^4$ S/m to about $2.25 \times 10^4$ S/m.

In embodiments, the composite material is flexible; the tensile strength of the composite material is at least 450 MPa; the volume fraction of carbon nanoscale fibers in the composite material is at least 35%, about 40% to about 80%, about 40% to about 75%, about 50% to about 70%, or about 60%; and the electrical conductivity of the composite material is at least $1.75 \times 10^4$ S/cm.

In embodiments, the composite material is flexible; the tensile strength of the composite material is at least 450 MPa; the volume fraction of carbon nanoscale fibers in the composite material is at least 35%, about 40% to about 80%, about 40% to about 75%, about 50% to about 70%, or about 60%; and the electrical conductivity of the composite material is about $1.8 \times 10^4$ S/m to about $3.0 \times 10^4$ S/m.

In embodiments, the composite material is flexible; the tensile strength of the composite material is at least 450 MPa; the volume fraction of carbon nanoscale fibers in the composite material is at least 35%, about 40% to about 80%, about 40% to about 75%, about 50% to about 70%, or about 60%; and the electrical conductivity of the composite material is about $2.0 \times 10^4$ S/m to about $3.0 \times 10^4$ S/m.

In embodiments, the composite material is flexible; the tensile strength of the composite material is at least 450 MPa; the volume fraction of carbon nanoscale fibers in the composite material is at least 35%, about 40% to about 80%, about 40% to about 75%, about 50% to about 70%, or about 60%; and the electrical conductivity of the composite material is about $2.0 \times 10^4$ S/m to about $2.5 \times 10^4$ S/m.

In embodiments, the composite material is flexible; the tensile strength of the composite material is at least 450 MPa; the volume fraction of carbon nanoscale fibers in the composite material is at least 35%, about 40% to about 80%, about 40% to about 75%, about 50% to about 70%, or about 60%; and the electrical conductivity of the composite material is about $2.0 \times 10^4$ S/m to about $2.25 \times 10^4$ S/m.

In embodiments, the composite material is flexible; the tensile strength of the composite material is at least 500 MPa; the volume fraction of carbon nanoscale fibers in the composite material is at least 35%, about 40% to about 80%, about 40% to about 75%, about 50% to about 70%, or about 60%; and the electrical conductivity of the composite material is at least $1.75 \times 10^4$ S/cm.

In embodiments, the composite material is flexible; the tensile strength of the composite material is at least 500 MPa; the volume fraction of carbon nanoscale fibers in the composite material is at least 35%, about 40% to about 80%, about 40% to about 75%, about 50% to about 70%, or about 60%; and the electrical conductivity of the composite material is about $1.8 \times 10^4$ S/m to about $3.0 \times 10^4$ S/m.

In embodiments, the composite material is flexible; the tensile strength of the composite material is at least 500 MPa; the volume fraction of carbon nanoscale fibers in the composite material is at least 35%, about 40% to about 80%, about 40% to about 75%, about 50% to about 70%, or about 60%; and the electrical conductivity of the composite material is about $2.0 \times 10^4$ S/m to about $3.0 \times 10^4$ S/m.

In embodiments, the composite material is flexible; the tensile strength of the composite material is at least 500 MPa; the volume fraction of carbon nanoscale fibers in the composite material is at least 35%, about 40% to about 80%, about 40% to about 75%, about 50% to about 70%, or about 60%; and the electrical conductivity of the composite material is about $2.0 \times 10^4$ S/m to about $2.5 \times 10^4$ S/m.

In embodiments, the composite material is flexible; the tensile strength of the composite material is at least 500 MPa; the volume fraction of carbon nanoscale fibers in the composite material is at least 35%, about 40% to about 80%, about 40% to about 75%, about 50% to about 70%, or about 60%; and the electrical conductivity of the composite material is about $2.0 \times 10^4$ S/m to about $2.25 \times 10^4$ S/m.

Carbon Nanoscale Fibers

As used herein, the phrase "carbon nanoscale fiber" refers to a thin, greatly elongated solid material comprising carbon, typically having a cross-section or diameter of less than 500 nm. The carbon nanoscale fibers may have an aspect ratio of about 100:1 to about 100,000:1. The aspect ratio may be greater than 100,000:1. In one embodiment, the carbon nanoscale fibers have a length of about 0.5 mm to about 1.2 mm, and a diameter of about 3 nm to about 10 nm. In a particular embodiment, the carbon nanoscale fibers have a length of about 1.0 mm, and a diameter of about 3 nm to about 8 nm. In another embodiment, the carbon nanoscale fibers have a length of about 1.0 mm, and a diameter of about 6 nm to about 8 nm.

The carbon nanoscale fibers may include CNTs. In embodiments, the carbon nanoscale fibers include single-wall carbon nanotubes (SWNTs), multi-wall carbon nanotubes (MWNTs), carbon nanofibers, and combinations thereof. In some embodiments, the CNTs are SWNTs. In particular embodiments, the CNTs are MWNTs. In still further embodiments, the CNTs are a mixture of SWNTs and MWNTs. In additional embodiments, the CNTs are a mixture of SWNTs, MWNTs, and carbon nanofibers.

As used herein, the phrase "carbon nanotubes" and the abbreviation "CNTs" generally refer to tubular graphite, which may be capped with fullerene structures. The CNTs may be a synthetic material having a wide molecular weight range that depends substantially on the diameter and length of the CNTs. CNTs are commercially available from companies such as General Nano, LLC (Cincinnati, Ohio, USA) and Nanocomp Technologies Inc. (NH, USA), or can be made using techniques known in the art. The CNTs can be pristine, in which the carbon fullerene tubes have fullerene end caps, or the CNTs can be non-pristine, for example, where the pristine CNTs have been chemically or mechanically altered (e.g., chopped) and then optionally functionalized to convert dangling carbon atoms to different functional groups, such as carbonyl or other oxygen containing groups. The sidewalls of the CNTs also may be functionalized to include one or more functional groups. The CNTs, in embodiments, also include one or more other nanomaterials, such as graphene, metal nanoparticles, or a combination thereof. In embodiments, the CNTs are pristine MWNTs. In other embodiments, the CNTs are non-pristine MWNTs. In some embodiments, the CNTs include a mixture of pristine MWNTs and pristine SWNTs. In still further embodiments, the CNTs include a mixture of pristine MWNTs and non-pristine SWNTs, or vice versa. In one embodiment, the CNTs are pristine SWNTs. In another embodiment, the CNTs are non-pristine SWNTs. In each of the foregoing embodiments, the sidewalls of at least a portion of the SWNTs, MWNTs, or a combination thereof may be functionalized. As used herein, the phrase "carbon nanofibers" refers to filamentous fibers that resemble whiskers of multiple graphite sheets or MWNTs.

In one embodiment, the carbon nanoscale fiber network comprises CNTs, and the carbon nanoscale fiber network is a buckypaper. Buckypapers may be made through the dispersion of CNTs in suspension followed by a filtration or evaporation process, or stretching or pushing synthesized nanotube "forests" to form sheets or strips.

The carbon nanoscale fiber networks herein may be rolled and/or pressed according to techniques known in the art. A rolling and/or pressing technique may be performed at any time during, before, and/or after any of the steps of the methods described herein are performed. For example, a rolling and/or pressing technique may be performed before, after, or both before and after the stretching of the carbon nanoscale fiber networks. The pressing may be a hot-pressing technique. In one embodiment, the carbon nanoscale fibers comprise CNTs, and the carbon nanoscale fiber network is stretched as described herein, and then subjected to hot-pressing.

Not wishing to be bound by any particular theory, it is believed that the stretching steps described herein or the stretching steps described herein in combination with at least one of rolling and pressing may achieve relatively dense packing and improved alignment of the carbon nanoscale fibers of the carbon nanoscale fiber networks.

Functionalization of the carbon nanoscale fibers and/or the carbon nanoscale fiber networks may be performed at any time during, before, and/or after any of the steps of the methods described herein are performed. Surface functionalization may be achieved by subjecting the carbon nanoscale fibers and/or carbon nanoscale fiber networks to microwaves, plasma, electron beam, chemical functionalization, or a combination thereof. Not wishing to be bound by any particular theory, it is believed that the surface functionalization techniques may improve at least one of the mechanical and electrical properties of the carbon nanoscale fibers and/or carbon nanoscale fiber networks.

Liquid Ceramic Precursors

The liquid ceramic precursors generally may be or include any substance capable of being converted to a ceramic material. In embodiments, the liquid ceramic precursor comprises one or more polysilazanes, polysiloxanes, polyborosiloxanes, polyborosilanes, polyborosilazanes, polycarbosiloxanes, polycarbosilanes, or combinations thereof. In one embodiment, the liquid ceramic precursor comprises a polysilazane. The polysilazane may be converted to silicon carbonitride upon curing and/or pyrolysis.

Applications

Due at least in part to their relatively high electrical conductivity, the composite materials provided herein may be used in many multifunctional applications, such as electromagnetic interference (EMI) shielding.

Due at least in part to their lightweight structures, high mechanical strength, high-temperature resistance, chemical inertness, or a combination thereof, the composite materials provided herein may play important roles in many defense-related applications, such as liquid-fueled rocket engine combustion devices (thrust chambers and nozzles), aircraft brakes, and thermal protection systems on hypersonic vehicles. The composite materials provided herein may be useful as an alternative for high-temperature, heavy metallic components and/or brittle ceramics in defense-related systems.

The composite materials provided herein may provide a new template for the design of high-temperature flexible electronics. Examples include, but are not limited to, high-temperature electronic components that are capable of adapting to the shape change of aerospace components while maintaining key functionality, such as sensing and actuating. The properties of the composite materials, especially the conductivities, may be adjusted, in embodiments, both along the in-plane direction and the through-thickness direction, by varying the material composition during the fabrication process.

When the composite materials are in the form of a flexible membrane, the composite materials can be used in thermal management, energy, and/or sensing in a number of environments, including harsh and/or extreme environments.

In the descriptions provided herein, the terms "includes," "is," "containing," "having," and "comprises" are used in an open-ended fashion, and thus should be interpreted to mean "including, but not limited to." When methods and composite materials are claimed or described in terms of "comprising" various components or steps, the composite materials and methods can also "consist essentially of" or "consist of" the various components or steps, unless stated otherwise.

The terms "a," "an," and "the" are intended to include plural alternatives, e.g., at least one. For instance, the disclosure of "a liquid ceramic precursor," "a carbon nanoscale fiber," "a carbon nanoscale fiber network", and the like, is meant to encompass one, or mixtures or combinations of more than one liquid ceramic precursor, carbon nanoscale fiber, carbon nanoscale fiber network, and the like, unless otherwise specified.

Various numerical ranges may be disclosed herein. When Applicant discloses or claims a range of any type, Applicant's intent is to disclose or claim individually each possible number that such a range could reasonably encompass, including end points of the range as well as any sub-ranges and combinations of sub-ranges encompassed therein, unless otherwise specified. Moreover, all numerical end points of ranges disclosed herein are approximate. As a representative example, Applicant discloses, in one embodiment, that the volume fraction of carbon nanoscale fibers in the composite material is about 50% to about 70%. This range should be interpreted as encompassing weight percentages in a range of about 50% to about 70%, and further encompasses "about" each of 51%, 52%, 53%, 54%, 55%, 56% 57%, 58%, 59%, 60%, 61%, 62%, 63%, 64%, 65%, 66%, 67%, 68%, and 69%, including any ranges and sub-ranges between any of these values.

EXAMPLES

The present invention is further illustrated by the following examples, which are not to be construed in any way as imposing limitations upon the scope thereof. On the contrary, it is to be clearly understood that resort may be had to various other aspects, embodiments, modifications, and equivalents thereof which, after reading the description herein, may suggest themselves to one of ordinary skill in the art without departing from the spirit of the present invention or the scope of the appended claims. Thus, other aspects of this invention will be apparent to those skilled in the art from consideration of the specification and practice of the invention disclosed herein.

Example 1—Formation of a Composite Material

One embodiment of a composite material was made according to the following procedure. Carbon nanotube sheets of randomly oriented multi-wall CNTs (Nanocomp Technologies, Inc.) were mechanically stretched. The multi-wall CNTs had an average diameter of about 6 nm to about 8 nm, and an average length of about 1 mm. The sheet was mechanically stretched until a stretch ratio of 35% was achieved. Not wishing to be bound by any particular theory, it was believed that the extremely high aspect ratio (>100,000) of the carbon nanotubes of this example contributed to the high ductility and super elasticity of the carbon nanotube networks, which allowed the network to be highly aligned by mechanical stretching process.

The mechanical stretching resulted in an aligned carbon nanotube sheet having a width of about 8 mm and a thickness of about 0.041 mm. The aligned carbon nanotubes sheet was cut to form a sheet about 38 mm in length.

In this example, polysilazane (PSZ) (KION Defense Technologies, Inc.) was used as the liquid preceramic precursor of silicon carbonitride (SiCN), and 4 wt. % dicumyl peroxide (Sigma-Aldrich Co.) was used as the thermal initiator. PSZ is a low viscosity liquid thermosetting resin with repeat units in which silicon and nitrogen atoms are bonded in an alternating sequence.

Not wishing to be bound by any particular theory, it was believed that the CNTs of the aligned carbon nanotube sheet formed a relatively tight mesh that included small pockets of empty space, which were infiltrated by the liquid polysilazane precursor of this example.

In this example, the liquid precursor was forced into these empty spaces with the aid of a vacuum. The sample was then cured into a solid preceramic state by thermal crosslinking at 140° C. for 24 hours. This process was based on the wet infiltration of liquid ceramic polymeric precursors, which is commonly called polymer impregnation and pyrolysis (PIP) process.

Following curing, it was believed that a solid mixture CNTs/PSZ was obtained where at least a portion of the carbon nanotubes were at least partially wrapped by the precursor.

A pyrolysis process was then performed at elevated temperatures (1000° C.) in nitrogen atmosphere. It was believed that the pyrolysis process decomposed the cured solid precursor in the carbon nanotube sheets into amorphous silicon carbonitride ceramics, thereby yielding a flexible ceramic nanocomposite. Not wishing to be bound by any particular theory, it was believed that at least a portion of the CNTs may have been exposed as a result of the pyrolysis process.

Smaller sized pores and spaces still existed internally, and these were further filled with a reiteration of the polymer impregnation and pyrolysis (PIP) process to obtain near fully-densified nanocomposites.

Therefore, the foregoing infiltration, curing, and pyrolysis steps were repeated once. The repeating of the steps, although optional, was believed to fill in and/or decrease the size of the spaces and/or pores that existed in the composite material prior to the repeating of the infiltration, curing, and pyrolysis steps.

As a result, four stages existed in the process of this example: (a) aligned CNTs sheet, (b) carbon nanotube sheet infiltrated by polysilazane (CNTs/PSZ), (c) carbon nanotube/silicon carbonitride nanocomposites (CNTs/SiCN1), and (d) carbon nanotube/silicon carbonitride nanocomposites with one more PIP process (CNTs/SiCN2).

Not wishing to be bound by any particular theory, it was believed that the high aspect ratio (>100,000), high ductility, and/or super elasticity of the carbon nanotubes allowed them to be aligned by the mechanical stretching method. The resulting aligned carbon nanotube sheet was believed to contain a closer packing of carbon nanotubes with fewer voids and lower porosity that the carbon nanotube sheet of randomly oriented carbon nanotubes.

The original dimensions (length×width×thickness) of the aligned CNTs sheet were 38 mm×8 mm×0.041 mm. After the foregoing infiltration and curing steps, it was believed that the pores and gaps were substantially filled with the solidified polysilazane, which was believed to at least partially wrap the carbon nanotubes.

During the polymer-ceramic conversion from polysilazane to silicon carbonitride, the density increased significantly from 1.1 g·cm$^3$ to 2.23 g·cm$^3$, and around 28% linear shrinkage occurred, which resulted in a large volume reduction.

FIG. 1 depicts the sample size change and the shrinkage percentage from CNTs/PSZ to CNTs/SiCN1 along the length, width, and thickness directions. As carbon nanotubes exhibit highly anisotropic mechanical and functional properties, it was believed that the aligned carbon nanotube sheet maintained the same anisotropic property, which may have caused the different shrinkage rates along these three directions. The shrinkage rate along the length direction was believed to be small as the cylindrical layer-structure of carbon nanotubes likely confined the carbon nanotube sheet's structure and restricted the shrinkage.

The size change that occurred during the pyrolysis process of this example also is summarized in the following table:

|  | Length/mm | Width/mm | Thickness/mm | Cross-sectional Area/mm$^2$ |
| --- | --- | --- | --- | --- |
| CNTs/PSZ | 38.58 | 7.93 | 0.041 | 0.33 |
| CNTs/SiCN1 | 38.55 | 6.87 | 0.028 | 0.19 |
| Shrinkage Percentage | 0.08% | 13.37% | 31.71% | 42.42% |

After the infiltration and curing process, the original dimensions (length×width×thickness) of CNTs/PSZ were 38.58 mm×7.93 mm×0.041 mm. The dimensions of CNTs/SiCN1 became 38.55 mm×6.87 mm×0.028 mm due to the pyrolysis process, indicating that the cross-sectional area along the alignment direction decreased 42.42%. It was believed that the shrinkage did not affect the alignment degree of carbon nanotubes; instead, it appeared to result in closer contact between each carbon nanotube.

Not wishing to be bound by any particular theory, it was believed that the sample size shrinkage came from the pyrolysis of the precursor inside each gap between pairs of carbon nanotubes. This was believed to cause or at least contribute to the noticeable shrinkage along the width and thickness directions as carbon nanotubes stacked onto each other along these two directions, which made the cross section (vertical to the carbon nanotube alignment direction) decrease and the carbon nanotubes stack more closely together. SEM images of the peeled CNTs/SiCN1 revealed that the material exhibited near perfect carbon nanotube alignment, which was believed to help efficient load-transfer. The shrinkage was believed to lead to closer contact between each adjacent pair of carbon nanotubes. The SEM images of the carbon nanotubes assembly in CNT sheets and CNTs/SiCN1, respectively, showed that some bunches of CNTs having a diameter around 150 nm were assembled together during the pyrolysis process. Some pores could also be found in CNTs/SiCN1, therefore, the composites could be densified by repeating the foregoing polymer impregnation and pyrolysis (PIP) processing steps.

The materials also were characterized with Raman spectroscopy, which was carried out on a Renishaw inVia micro-Raman system using a 785 nm excitation wavelength (1.58 eV) diode laser. Typical laser power was 0.5 mW with a 50× magnification objective lens, and the laser beam size was around 1 mm in diameter. Peaks at 1340 cm$^{-1}$ (D band) and 1589 cm$^{-1}$ (G band) were the main features of sp2 crystalline graphitic structures. A peak at 2660 cm$^{-1}$ (G' band) was believed to reveal the limited layer nature of the carbon nanotubes in their as-received state and in the composite materials. A relatively lower G' band in the composites was believed to suggest the possible overlapping of carbon nanotubes. Compared with aligned carbon nanotubes, the intensity of the D band became much higher in CNTs/SiCN1 and CNTs/SiCN2 composites. It was believed that the defective nature of CNTs in the composites may be ascribed to the changes in Raman analysis. It also was believed that the reaction between carbon nanotubes and polysilazane during the pyrolysis process at high temperatures may have introduced certain defects.

The flexibility, mechanical properties, and microstructure of the composite materials of this example were characterized and studied, as explained in the following examples, along with the toughening mechanism of carbon nanotubes in the composite materials.

Example 2—Flexibility Test

A flexibility test of the composite material of Example 1 was carried out on a motorized linear stage (Zaber Technologies Inc.). Samples of the composite material of Example 1 were held between two cylindrical rods. One of the rods was movable, and the other was stationary.

Surprisingly, the samples of Example 1 were bent 1000 times to 50% and 75% of their original length without breakage. Moreover, it was unexpectedly observed that the flexural strength and modulus of the samples were not substantially diminished as a result of the flexibility test.

During the flexibility test of this example, the bending percentage was monitored by the travel distance of the movable rod and the machine was stopped at a specific bending percentage. In this example, 50% and 75% were the two bending percentages tested. The "bending percentage" was the percentage of the sample's length traveled by the moving rod, i.e., the movable rod would move 7.5 mm towards the stationary rod if a composite material sample 10 mm long were placed between the rods. The bending tests of this example were repeated 500 and 1000 times. The travel distance and repetition times of the movable rod were controlled by a step motor.

During the flexibility test, two factors were controlled: the bending percentage (α) and the number of bending times. The bending percentage is described by the following equation:

$$\alpha = \frac{l_0 - l_1}{l_0} \times 100\%$$

where $l_0$ is the original length of the composite material, and $l_1$ is the smallest distance between the two rods during the flexibility test, which was monitored by the travel distance of the movable rod.

The detailed test conditions and resultant mechanical properties of the composite materials are provided in the following table:

| Item | Bending Percentage (α) | Times | Tensile Strength (MPa) | Young's Modulus (GPa) |
| --- | --- | --- | --- | --- |
| 1 | 0 | 0 | 501.34 ± 7.53 | 101.24 ± 1.22 |
| 2 | 50% | 500 | 511.51 ± 4.06 | 97.11 ± 1.56 |
| 3 | 50% | 1000 | 504.01 ± 5.23 | 92.54 ± 1.85 |
| 4 | 75% | 1000 | 495.51 ± 6.91 | 97.32 ± 5.43 |

As an example, for Item 4 of the foregoing table (75%, 1000 times) the length of the composite material was 38 mm, and the composite material was pressed until the distance between the two rods was 9.5 mm. The movable rod was moved back and forth 1000 times under this condition.

Due to the flexibility of the composite materials, the samples also were bent with fingertip pressure sufficient to cause the two ends of the sample to touch each other. After the bending deformation, the flexible ceramic nanocomposites were able to reflect back fully to the original shape.

Not wishing to be bound by any particular theory, it was believed that the flexible ceramic nanocomposites showed two features in this example: thin structure and excellent toughening effect of carbon nanotubes. The thin structure was believed to make the flexural rigidity very small, which is defined as the force couple required to bend a structure, as shown in the following equation:

$$D = \frac{Eh^3}{12(1-v^2)}$$

wherein D is flexural rigidity, E is the Young's modulus, v is the Poisson's ratio, and h is the thickness. The flexural rigidity was determined by the Young's modulus, Poisson's ratio, and the thickness. Taken from the experimental results of the composite materials of Example 1, the Young's modulus was about 110 GPa, and the thickness was about 28 μm. The Poisson's ratio was taken as 0.35, so the flexural rigidity of the composite materials was about $2.3 \times 10^{-4}$ Pa·m$^3$, which indicated that the composite materials were easily bendable.

Figure 2A:
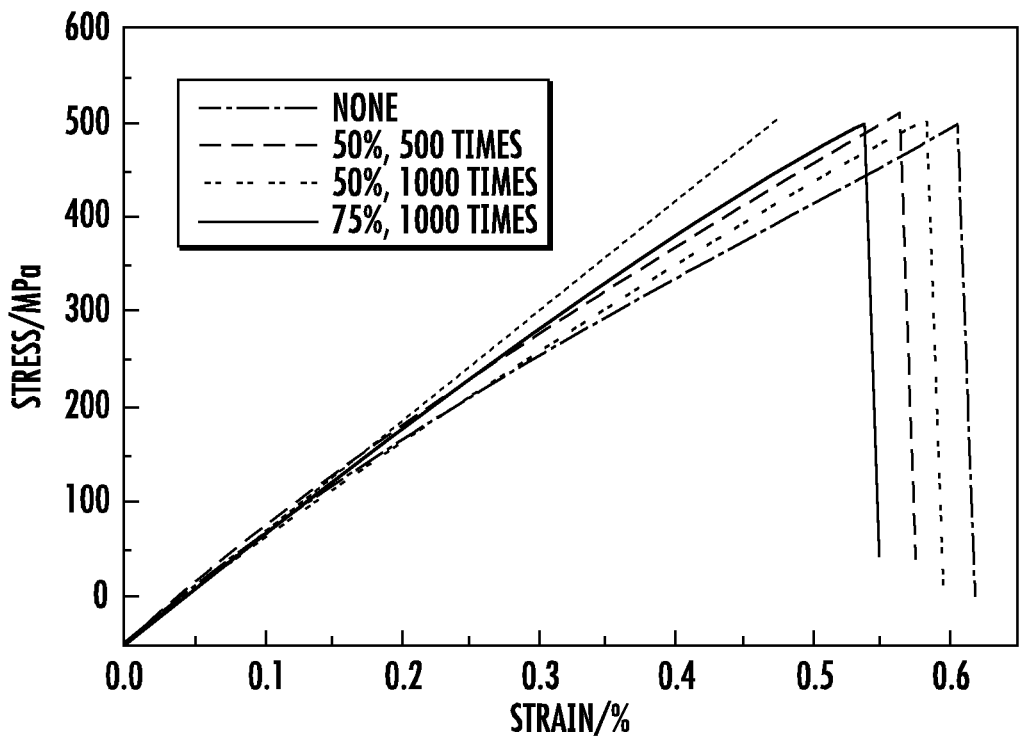
FIG. 2A depicts the stress-strain curves of one embodiment of a composite material prior to and after several flexibility tests.
Figure 2B:
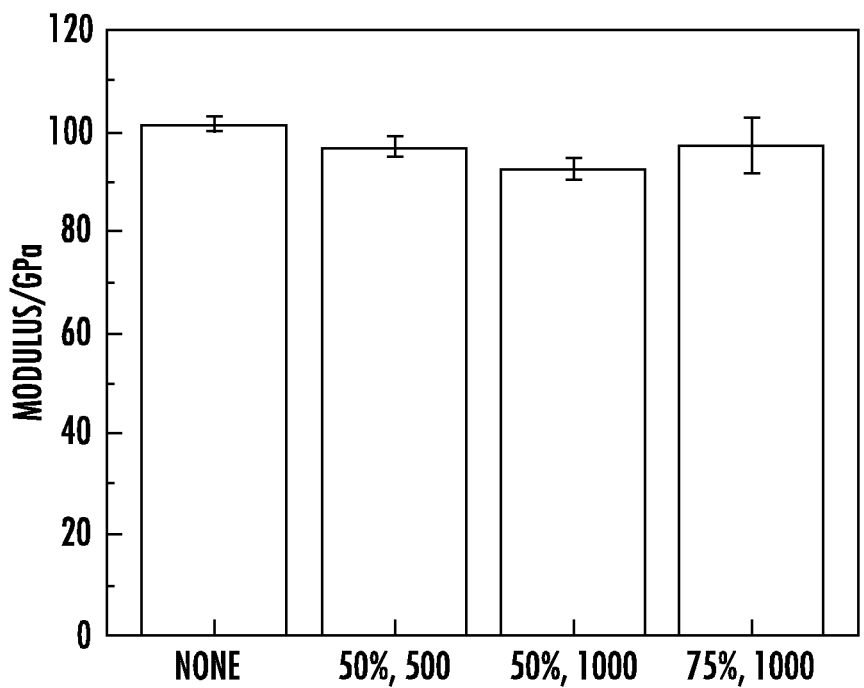
FIG. 2B depicts the Young's modulus of one embodiment of a composite material prior to and after several flexibility tests.

FIG. 2A depicts the mechanical properties of the composite material of Example 1 before (Item 1 of the foregoing Table) and during the various flexibility tests (Items 2-4 of the foregoing Table). The sample not subjected to a flexibility test (Item 1 of the foregoing Table) is labeled "None" at FIG. 2A. All the samples initially exhibited a linear stress-strain relationship. The Young's Modulus of each sample, which is depicted at FIG. 2B, was obtained from the slope of the linear portion of the stress-strain curve. Not wishing to be bound by any particular theory, it was believed that due to the toughening of CNTs in the composite materials, deviation from the linear response was observed in the stress-strain curves as the load continued.

The tensile strength and modulus of the composite materials after the flexibility test were substantially maintained at a constant level compared to the sample not subjected to the flexibility testing. SEM images of the composite materials after the flexibility test (75%, 1000 times) showed that no apparent crack appeared on the surface of the composite materials after the flexibility test. Similar fracture surface and carbon nanotube pullout phenomenon also were observed in the SEM images of the composite materials subjected to the flexibility test. The flexibility tests of this example, therefore, were believed to demonstrate that the composite materials of Example 1 at least substantially retained the original mechanical properties and microstructures, which was believed to indicate excellent compliance and/or durability.

Example 3—Mechanical Properties and Characterization of Microstructures

The mechanical properties of the composite materials of Example 1 were tested according to the following procedures.

A tensile strength test was carried out to measure the mechanical properties of the aforementioned materials during the fabrication process. The tensile strength measurements were conducted by a tensile machine (AGS-J, Shimadzu Scientific, Inc.) with a crosshead speed of 0.5 mm·min$^{-1}$. The strain change was recorded by a non-contact video extensometer DVE-201. To meet the tensile test requirement, the effective size of the sample was controlled to 2 mm in width and 15 mm in gauge length approximately.

Five samples were used in the mechanical test to ensure repeatability. The tensile strength was obtained by taking the average value of the five tests, and Young's modulus was obtained from the slope of each linear plot, as explained below. P 1000 grade sand paper tabs were used to make dog-bone shaped samples, and meet the tensile test standard.

The microstructures of the flexible ceramic nanocomposites after the tensile strength test were observed using a scanning electron microscope (SEM, JEOL JSM-7401F).

Figure 3A:
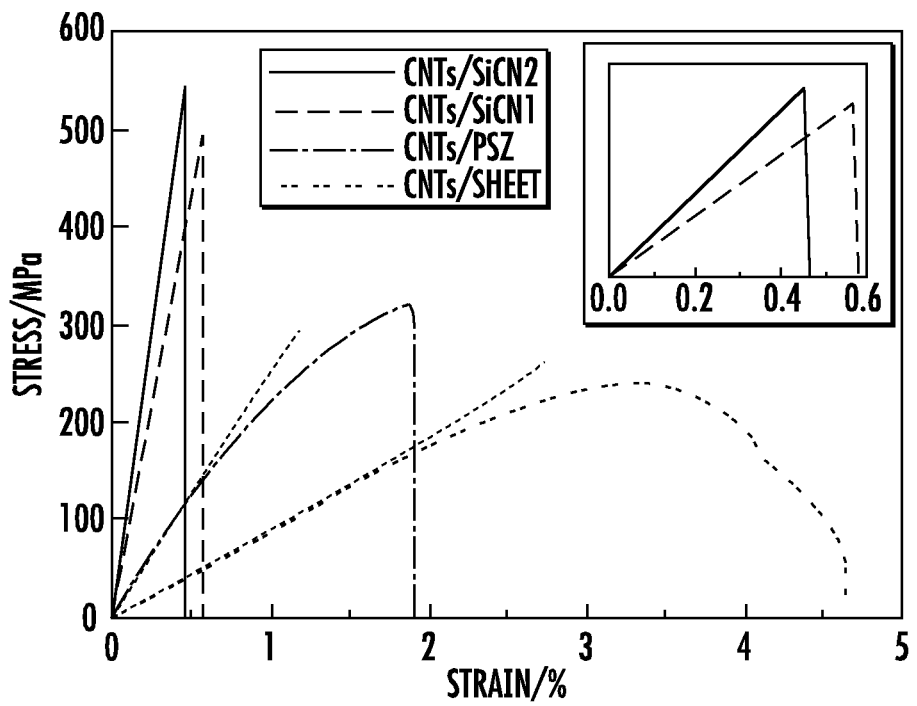
FIG. 3A depicts the stress-strain curves of two embodiments of a composite material, an embodiment of a composite material prior to pyrolysis, and an embodiment of an aligned CNT sheet.

FIG. 3A depicts the tensile stress-strain curves of the four materials tested in this example: [1] the aligned CNT sheet of Example 1 ("CNTs sheet"), [2] the aligned CNT sheet infiltrated with cured PSZ ("CNTs/PSZ"), [3] the aligned CNT sheet with cured PSZ after pyrolysis ("CNTs/SiCN1"), and [4] the composite material of Example 1 ("CNTs/SiCN2").

All four curves initially exhibited a linear stress-strain relationship. The linear portion of each curve was the elastic region, and Young's modulus was obtained from the slope of the linear fits depicted by the dotted line at FIG. 3A.

Figure 3B:
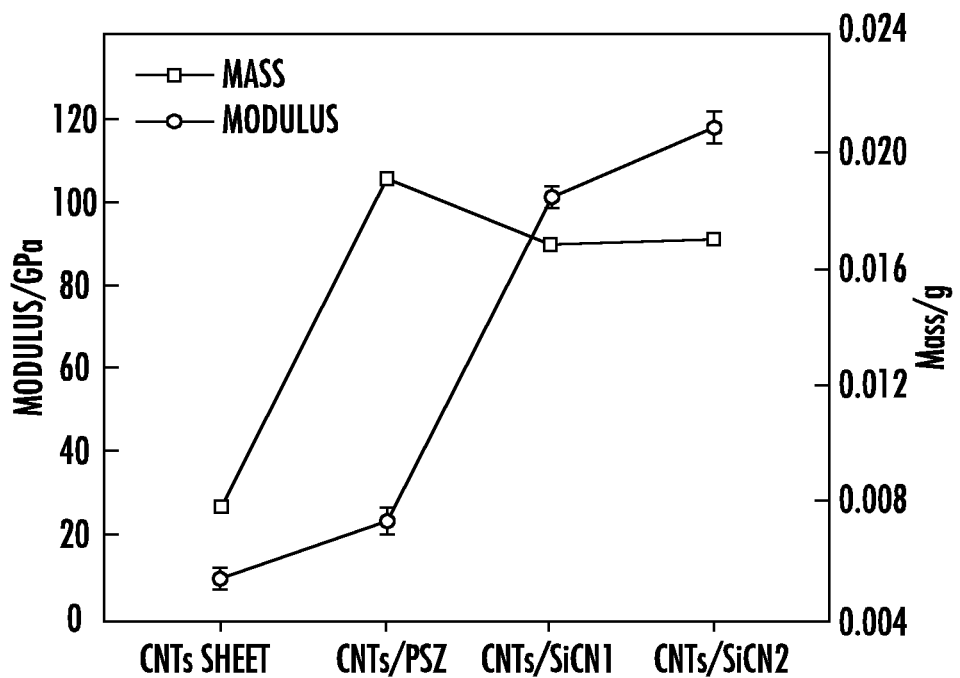
FIG. 3B depicts the Young's modulus and mass change of two embodiments of a composite material, an embodiment of a composite material prior to pyrolysis, and an embodiment of an aligned CNT sheet.

A comparison of the Young's modulus and mass increase is depicted at FIG. 3B. From the mass increase and size change of the four materials (i.e., from CNTs sheet to CNTs/SiCN2), the volume fraction of carbon nanotubes in the composite material of Example 1 was calculated to be about 60%.

Not wishing to be bound by any particular theory, it was believed that the aligned carbon nanotube sheet of FIG. 3A exhibited a nonlinear elastic response due, at least in part, to its high ductility. It was believed that due to the fact that the carbon nanotube sheet of Example 1 had been aligned by mechanical stretching, the sheet had a high tensile strength along the alignment direction. The tensile strength of the CNTs sheet was 240.78±9.64 MPa. The relatively large failure strain in the aligned CNTs sheet was believed to result from the carbon nanotubes' intrinsic flexibility and high failure elongation, which also was believed to result in the Young's modulus of 9.14±0.47 GPa along the aligned direction, as shown at FIG. 3A and FIG. 3B.

The CNTs/PSZ was a type of thermoset polymer matrix composite. Not wishing to be bound by any particular theory, it was believed that a deviation from the linear response in the stress-strain curve as the load continued was observed at FIG. 3A for CNTs/PSZ because of the toughening of carbon nanotubes for CNTs/PSZ.

During the tensile test, it was believed that the load was transferred from the polymer matrix to the carbon nanotubes via interfacial bonding. The tensile strength and Young's modulus of CNTs/PSZ reached 318.12±8.47 MPa and 23.16±2.46 GPa, respectively, which was 132% and 253% of the aligned CNTs sheet's values, respectively.

After the pyrolysis process, the tensile strength of CNTs/SiCN1 reached 501.34±7.55 MPa, which was 208% of the aligned CNTs sheet's value, as shown at FIG. 3A. The cured polysilazane in the materials was believed to transform into silicon carbonitride ceramic during the pyrolysis process. Due to the fact that ceramics typically have high elastic modulus, the pyrolysis was believed to result in the significant enhancement of the Young's modulus of CNTs/SiCN1, which was 101.24±1.22 GPa, compared to the aligned CNTs sheet.

Further polymer impregnation and pyrolysis was believed to improve the mechanical strength of the nanocomposites of Example 1 through enhanced densification (tensile strength: 536.33±7.23 MPa and Young's modulus: 117.78±3.21 GPa), which was a 223% and 1289% improvement over the pristine aligned carbon nanotubes sheet, respectively.

The nonlinear behavior of CNTs/SiCN1 and CNTs/SiCN2 was also observed in their tensile stress-strain curves. The inset plot of FIG. 3A was believed to at least partially explain the deviation from the linear response of the tensile stress-strain curves and the toughening mechanism of carbon nanotubes in CNTs/SiCN1 and CNTs/SiCN2.

SEM images of the fracture surfaces of the four samples were collected after the tensile test. The SEM image of the aligned CNT sheet depicted a sheet break with a large width of the sheet tapered to several small bundles of CNTs, which was believed to indicate a non-brittle fracture. The carbon nanotubes pullout was observed at the fracture surface of an SEM image of the CNTs/PSZ material. Not wishing to be bound by any particular theory, it was believed that the load transfer between carbon nanotubes and the polymer matrix played a critical role for the failure modes. A unique fracture surface was observed for the carbon nanotubes reinforced ceramic matrix composites. The fracture surfaces showed long pullouts of carbon nanotubes.

The SEM images also demonstrated that the thickness of CNTs/PSZ was much larger than the thicknesses of CNTs/SiCN1 and CNTs/SiCN2, which was believed to verify the size change that occurred during the pyrolysis process.

SEM images also were used to determine the length of carbon nanotubes pullout of the samples after the tensile test. Surprisingly, the length of the carbon nanotubes pullout was about 15 μm for CNTs/PSZ, CNTs/SiCN1, and CNTs/SiCN2.

Conventional toughening mechanisms in fiber reinforced ceramic composite, such as fiber pullout, debonding, and sliding at the fiber/matrix interface, were believed to explain these phenomena. It was believed that in fiber reinforced brittle ceramic matrix composite systems, the energy consumed by the fiber pullout, debonding, and sliding against the interface stress between fiber and ceramic matrix mostly contributed to the toughening of the samples. It has been demonstrated that the energy dissipated during the fiber-ceramic debonding and fiber pullout can be calculated by Equations (1) and (2), respectively:

$$G_{debond} = \frac{2V_f L G_i}{r} \quad (1)$$

$$G_{pullout} = \frac{V_f L^2 \tau_i}{r} \quad (2)$$

where $V_f$ is the fiber volume fraction, L is the pullout length, $G_i$ is the interface fracture energy, $\tau_i$ is the interfacial shear stress, and r is the fiber radius.

Equations (1) and (2) also were believed to provide a general understanding about the toughening factors of carbon nanotubes on a ceramic matrix, such as the volume fraction of carbon nanotubes, the interface strength between carbon nanotubes and silicon carbonitride matrix, and the length of carbon nanotubes pullout. As explained at Example 3, the volume fraction of carbon nanotubes in the ceramic matrix composites of Example 1 was 60%. The length of carbon nanotubes pullout, as determined by the SEM images, was about 15 μm.

Therefore, the following experimental values were used in an analysis relying on Equations (1) and (2): $V_f$=60%, L=15 μm, and r=8 nm. The interfacial shear stress (Ti) was taken from a literature value (10 MPa), and an estimate of $G_i$=4 J/m² for glass matrix materials was used in the calculations. Compared to carbon fiber reinforced silicon carbide composites ($C_f$/SiC) and other carbon nanotubes/ceramic composites, the $G_{debond}$ and $G_{pullout}$ of the composite material of Example 1 was relatively large, as shown at the following table:

| Sample | $V_f$(%) | L (μm) | R (nm) | $G_{debond}$ (J/m²) | $G_{pullout}$ (J/m²) |
|---|---|---|---|---|---|
| $C_f$/SiC[30] | 40 | 100 | 7 × 10³ | 45.1 | 5.71 × 10³ |
| CNTs/SiO₂[39] | 10 | 0.1 | 10 | 8 | 1 |
| Example 1 | 60 | 15 | 8 | 9 × 10³ | 1.68 × 10⁵ |

Not wishing to be bound by any particular theory, it was believed that a significantly longer pullout length and a high volume fraction of carbon nanotubes can cause substantial increases in $G_{pullout}$ and $G_{debond}$, thereby increasing the toughening effect.

Example 4—Electrical Properties and Anisotropy

Figure 4:
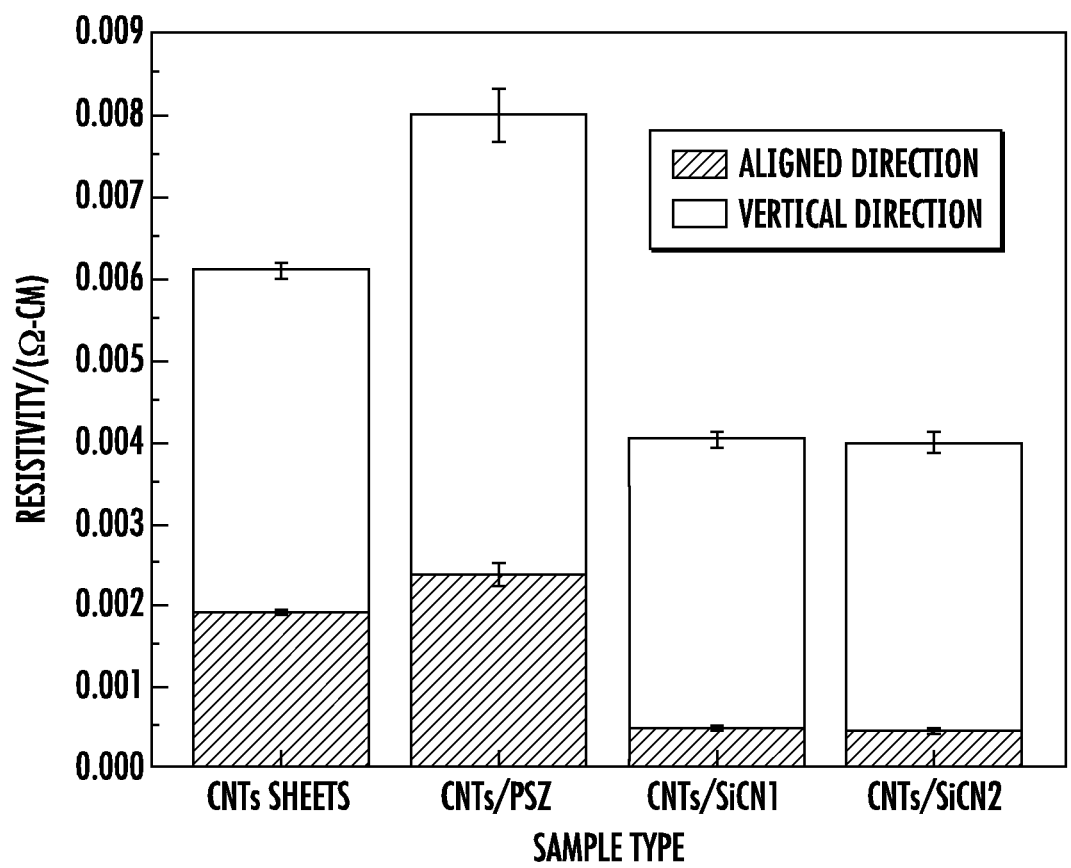
FIG. 4 depicts the electrical resistivity in two directions of two embodiments of a composite material, an embodiment of a composite material prior to pyrolysis, and an embodiment of an aligned CNT sheet.

The electrical properties of the composite material of Example 1 were tested. The electrical properties were obtained by a four probe method, and the results demonstrated anisotropy along the CNT aligned direction and the vertical direction. The results are depicted at FIG. 4.

Surprisingly, the electrical resistivity of the ceramic membrane was only a quarter of the value of the CNT sheet.

Specifically, the electrical conductivity was measured using the four-probe method (Jandel universal probe system with Keithley 2002 MEM multimeters). It was tested five times for each sample and the electrical conductivity was obtained by calculating the average value. The influence of the pyrolysis process on the anisotropy of the electrical properties was investigated.

In this example, the high volume fraction, high aspect ratio (>100,000), and good alignment of carbon nanotubes were believed to make the ceramic nanocomposites of Example 1 demonstrate ultra-high electrical conductivity. The electrical conductivity along ($\sigma_\parallel$) and vertical ($\sigma_\perp$) to the length direction is summarized at FIG. 5A and FIG. 5B.

As the electron charge ran along the length of the carbon nanotube much more readily than it jumped through the carbon nanotube, the carbon nanotube alignment was believed to lead to the anisotropy of $\sigma_\parallel$ and $\sigma_\perp$ for all of the samples. In this example, the values of $\sigma_\parallel$ were much higher than that of $\sigma_\perp$, which was also demonstrated by the value of $\sigma_\parallel/\sigma_\perp$.

For the CNTs sheet, the values of $\sigma_\parallel$ and $\sigma_\perp$ were 5.3×10⁴ and 1.6×10⁴ S·m⁻¹ separately, meaning $\sigma_\parallel/\sigma_\perp$ was equal to 3.3. The high electrical conductivity was attributed to the percolation network of carbon nanotubes. The high concentration and alignment was believed to realize a high degree of carbon nanotubes contact. It was believed that there were two sources of electrical resistance in the CNTs sheet: the intrinsic resistance along the carbon nanotubes and the contact resistance at the carbon nanotube junction points. It was believed that the contact resistance strongly depended on the contact length at the carbon nanotube junctions, carbon nanotube diameter, and atomic structures in the contact region. The high concentration and alignment promised a high degree of contact between rigid neighboring carbon nanotubes.

Figure 5A:
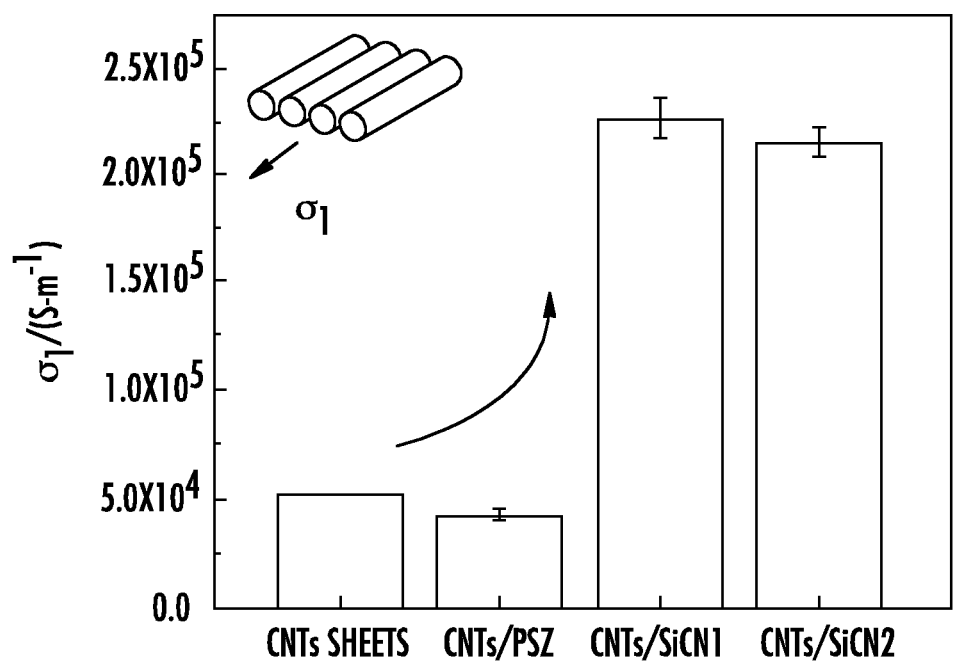
FIG. 5A depicts the electrical conductivity of embodiments of starting materials and composite materials along a particular direction.
Figure 5B:
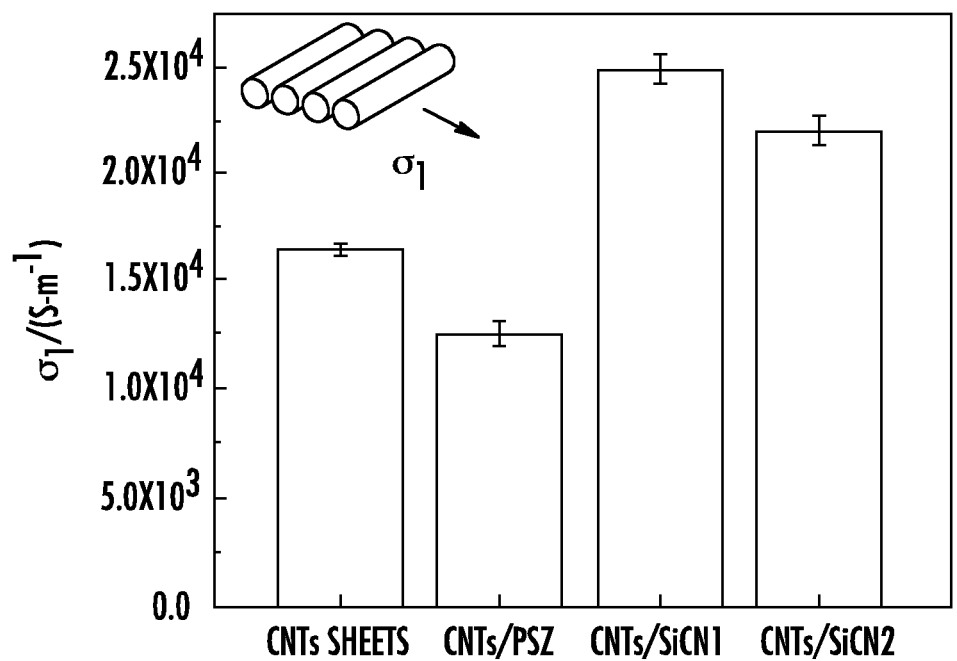
FIG. 5B depicts the electrical conductivity of embodiments of starting materials and composite materials along a particular direction.
Figure 5C:
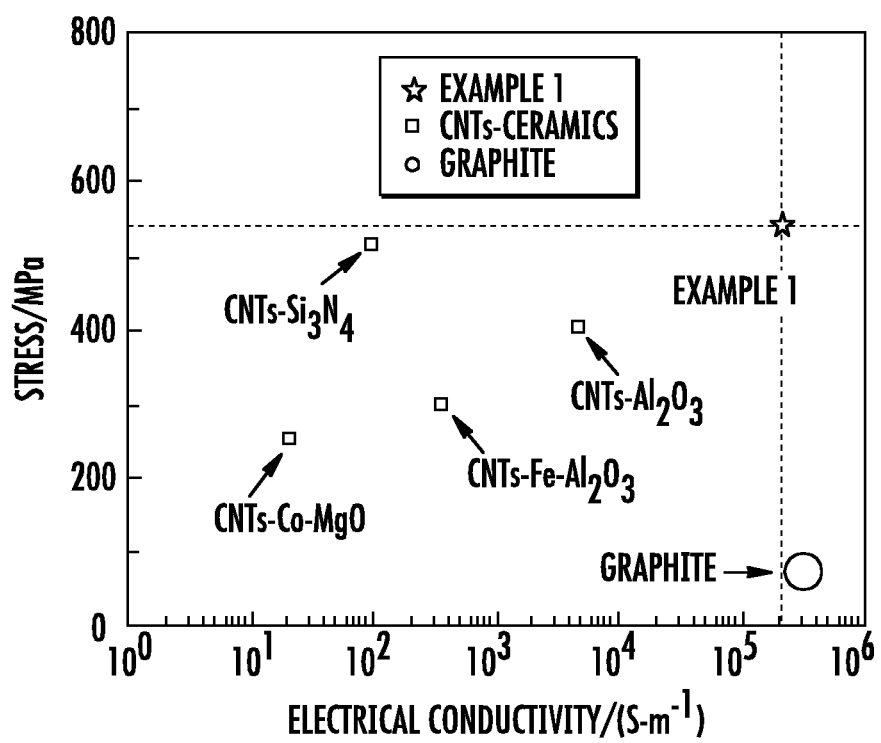
FIG. 5C compares the electrical conductivity of one embodiment of a composite material with other materials and graphite.

After the polymeric precursor was infiltrated into the carbon nanotube sheet to make the CNTs/PSZ of Example 1, it was believed that the pores in the aligned carbon nanotube sheet were at least partially filled with polymeric precursor. The surfaces of the ceramic composites of this example were observed using a scanning electron microscope (SEM, JEOL JSM-7401F) and atomic force microscopy (AFM, Veeco Instruments Inc.). A thin polymer layer was coated on the surface of the carbon nanotube sheet. Due to the fact that the polymer was insulating, both $\sigma_\parallel$ and $\sigma_\perp$ reduced slightly compared to the value of the CNT sheet, as shown at FIG. 5A and FIG. 5B. The pyrolysis process from CNTs/PSZ to CNTs/SiCN1 caused a dramatic change of the electrical conductivity. The value of $\sigma_\parallel$ for CNTs/SiCN1 reached up to $2.3 \times 10^5$ S·m$^{-1}$ (see FIG. 5A). When the materials of Example 1 were compared with other representative carbon nanotube-ceramic nanocomposites and graphite, it was found that the electrical conductivity of the composite materials of Example 1 were at the same level as that of graphite in the basal plane, as shown at FIG. 5C. Specifically, the electrical conductivity of the ceramic composites along the alignment direction was $2.2 \times 10^5$ S·m$^{-1}$, which was at the same level as the electrical conductivity of graphite in the basal plane. The anisotropy of electrical conductivity increased from 3.3 to 9.2 after the pyrolysis process. Therefore, unprecedentedly high electrical conductivity was surprisingly achieved in the composite materials of Example 1. These results also were believed to indicate that the composite materials of Example may be useful for electromagnetic interference shielding.

As explained at Example 1, the precursor was transferred from a polymer state to a ceramic state with shrinkage occurring during the pyrolysis process. Not wishing to be bound by any particular theory, this shrinkage was believed to improve the electrical conductivity of the ceramic nanocomposites for at least one of two reasons. First, the shrinkage was believed to change the sample size, especially along the width and thickness directions. The shrinkage likely caused the carbon nanotubes to stack more closely together, thereby improving electron transport. Second, as seen in SEM images, the thin polymer layer on the surface of the carbon nanotube sheet likely hampered the electron charge for CNTs/PSZ, and the shrinkage likely exposed carbon nanotubes on the surface for CNTs/SiCN1. Some carbon nanotubes appeared to be exposed outside. As a result, it was believed that the pyrolysis process played an important role on the mechanical and electrical properties of resultant ceramic nanocomposites.

These explanations were verified by the microstructure characterization (via SEM and AFM (i.e., atomic force microscopy)) of the nanocomposites' surface from CNTs/PSZ and CNTs/SiCN1. The value of $\sigma_\perp$ almost doubled from CNTs/PSZ to CNTs/SiCN1, as shown at FIG. 5B, which was believed to be due to the closer packing of carbon nanotubes. However, $\sigma_\parallel$ was significantly higher than $\sigma_\perp$ and $\sigma_\parallel/\sigma_\perp$ increased to 9.2 after the pyrolysis process, which was believed to demonstrate more significant anisotropy for CNTs/SiCN1. After the PIP process was repeated, as explained at Example 1, CNTs/SiCN2's electrical conductivity became $2.2 \times 10^5$ S·m$^{-1}$, and the $\sigma_\parallel/\sigma_\perp$ was still 9.2.

Example 5—Thermal Properties

The thermal properties of the composite material of Example 1 were tested. The thermal properties were characterized using a laser beam and the temperature was read from an Infrared camera.

During the experiment, a laser beam was shot at the center of the sample. The temperature profiles at two different locations were tested: [1] a spot in the middle of the sample, and [2] a spot on the edge of the sample (along the longitude direction). These tests revealed that the ceramic membrane had a relatively high thermal conductivity, which was believed to permit heat to be dissipated quickly from the heating source to surrounding areas.

Figure 6:
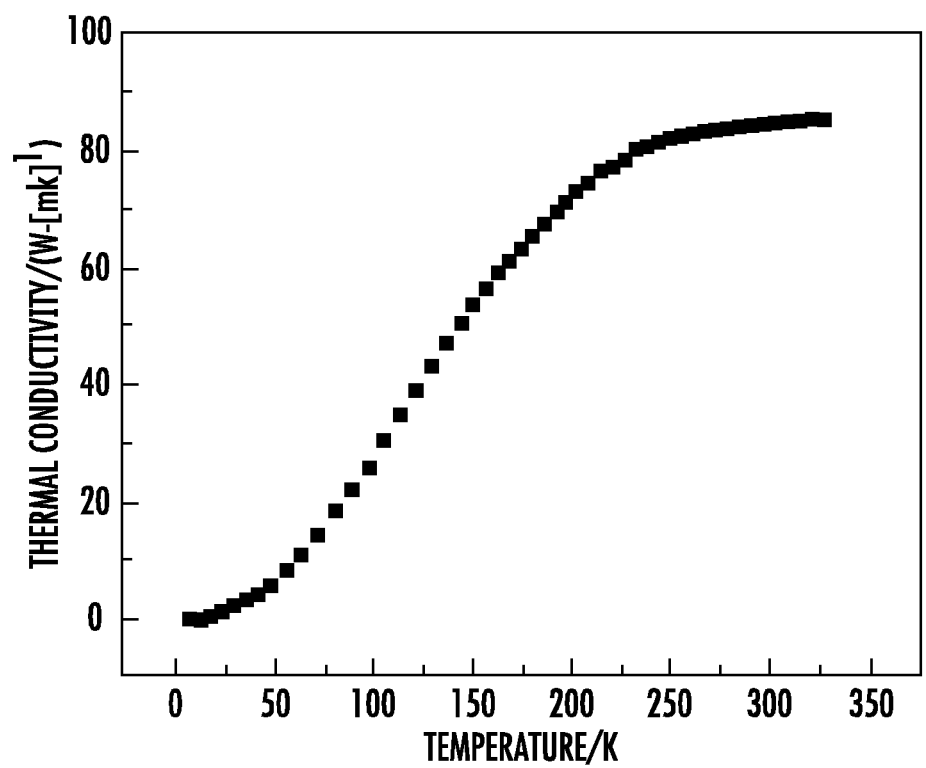
FIG. 6 depicts the temperature-dependent in-plane thermal conductivity of one embodiment of a composite material.

The temperature-dependent in-plane thermal conductivity of CNTs/SiCN1 is depicted at FIG. 6. It was believed that due to the fact that the composite material of Example 1 was obtained from an aligned carbon nanotube sheet having a stretch ratio of 35%, the thermal transport along the alignment direction was improved in the resulting composite materials. At room temperature, the thermal conductivity increased up to 84 W/(m*K) along the alignment direction.

I claim:

1. A composite material comprising:
a ceramic material dispersed in a carbon nanoscale fiber network which (a) comprises a plurality of substantially aligned mechanically stretched carbon nanoscale fibers having an aspect ratio greater than 100,000:1, and (b) is in the form of a sheet or a strip,
wherein the composite material (i) includes a volume fraction of the plurality of substantially aligned carbon nanoscale fibers of at least 35%, and (ii) has an electrical conductivity of at least $1.75 \times 10^4$ S/m.

2. The composite material of claim 1, wherein the composite material is flexible.

3. The composite material of claim 1, wherein the volume fraction of the plurality of substantially aligned carbon nanoscale fibers in the composite material is about 40% to about 80%.

4. The composite material of claim 1, wherein the electrical conductivity of the composite material is about $2.0 \times 10^4$ S/m to about $3.0 \times 10^4$ S/m.

5. The composite material of claim 1, wherein the composite material has a tensile strength of at least 400 MPa.

6. The composite material of claim 1, wherein the composite material has a tensile strength of about 450 MPa to about 650 MPa.

7. The composite material of claim 1, wherein the ceramic material comprises silicon carbonitride.

8. The composite material of claim 1, wherein the ceramic material is evenly dispersed in the carbon nanoscale fiber network.

9. The composite material of claim 1, wherein the plurality of substantially aligned carbon nanoscale fibers comprises single-wall carbon nanotubes, multi-wall carbon nanotubes, or a combination thereof.

10. The composite material of claim 1, wherein the mechanically stretched carbon nanoscale fiber network is a buckypaper.

11. The composite material of claim 1, wherein the plurality of substantially aligned carbon nanoscale fibers comprises pristine carbon nanotubes.

* * * * *